(12) United States Patent
Schupbach

(10) Patent No.: US 6,423,940 B1
(45) Date of Patent: Jul. 23, 2002

(54) TEMPERATURE STABILIZATION SCHEME FOR A CIRCUIT BOARD

(75) Inventor: Steven Schupbach, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/798,320

(22) Filed: Mar. 2, 2001

(51) Int. Cl.[7] .................................................. H05B 1/00
(52) U.S. Cl. ........................ 219/209; 219/210; 219/543; 361/720; 361/721
(58) Field of Search ................................. 219/209, 210, 219/543, 548; 361/78, 103, 719, 720, 721, 722; 340/601; 174/250, 257, 259, 260

(56) References Cited

U.S. PATENT DOCUMENTS

| | | | | |
|---|---|---|---|---|
| 3,289,046 A | * | 11/1966 | Carr | 219/209 |
| 3,395,265 A | * | 7/1968 | Weir | 219/209 |
| 3,440,407 A | * | 4/1969 | Goltsos et al. | 219/209 |
| 3,816,702 A | * | 6/1974 | Green | 219/209 |
| 4,374,316 A | * | 2/1983 | Inamori et al. | 219/209 |
| 4,481,403 A | * | 11/1984 | Del Monte | 219/209 |
| 5,539,186 A | * | 7/1996 | Abrami et al. | 219/548 |
| 5,574,627 A | * | 11/1996 | Porter | 361/719 |
| 5,896,259 A | * | 4/1999 | Farwell et al. | 361/78 |
| 6,114,674 A | * | 9/2000 | Baugh et al. | 219/543 |
| 6,184,494 B1 | * | 2/2001 | Isokoski et al. | 219/209 |
| 6,262,392 B1 | * | 7/2001 | Morton et al. | 219/209 |

* cited by examiner

Primary Examiner—Teresa Walberg
Assistant Examiner—Fadi H. Dahbour
(74) Attorney, Agent, or Firm—John L. Imperato

(57) ABSTRACT

A temperature stabilization scheme reduces the effects of temperature variations on the performance of an electronic system that is implemented on a circuit board. In the temperature stabilization scheme, the circuit has an isolated region that is coupled to a remainder of the circuit board by one or more electrical pathways. Associated with each of the electrical pathways is an incidental thermal conduction path between the isolated region and the remainder of the circuit board. A temperature sensitive component of the electrical system is coupled to a mounting site on the isolated region and interfaces with the remainder of the circuit board through the one or more electrical pathways. A series of heaters, thermally coupled to the isolated region provides a compensating thermal profile that opposes thermal instability caused by the incidental thermal conduction paths, where the opposition is over a portion of the isolated region that includes at least the mounting site of the temperature sensitive component. The series of heaters also sets the isolated region to a predetermined average temperature.

15 Claims, 6 Drawing Sheets

TEMPERATURE STABILIZATION SCHEME FOR A CIRCUIT BOARD

BACKGROUND OF THE INVENTION

Modem electronic systems that are implemented on circuit boards can be complex and highly integrated. When temperature sensitive components are included in these systems, system performance can be degraded by temperature variations imposed upon these components, absent some form of compensation for the temperature variations. For example, level accuracy of an amplitude control system decreases according to temperature variations imposed on a detector within the amplitude control system, absent compensation for the temperature variations. There is a need to reduce the influence of temperature variations on the performance of electronic systems that are implemented on a circuit board.

SUMMARY OF THE INVENTION

A temperature stabilization scheme constructed according to the preferred embodiment of the present invention reduces the influence of temperature variations on the performance of electronic systems that are implemented on circuit boards.

DETAILED DESCRIPTION OF THE PREFERRED EMBODIMENT

Figure 1:
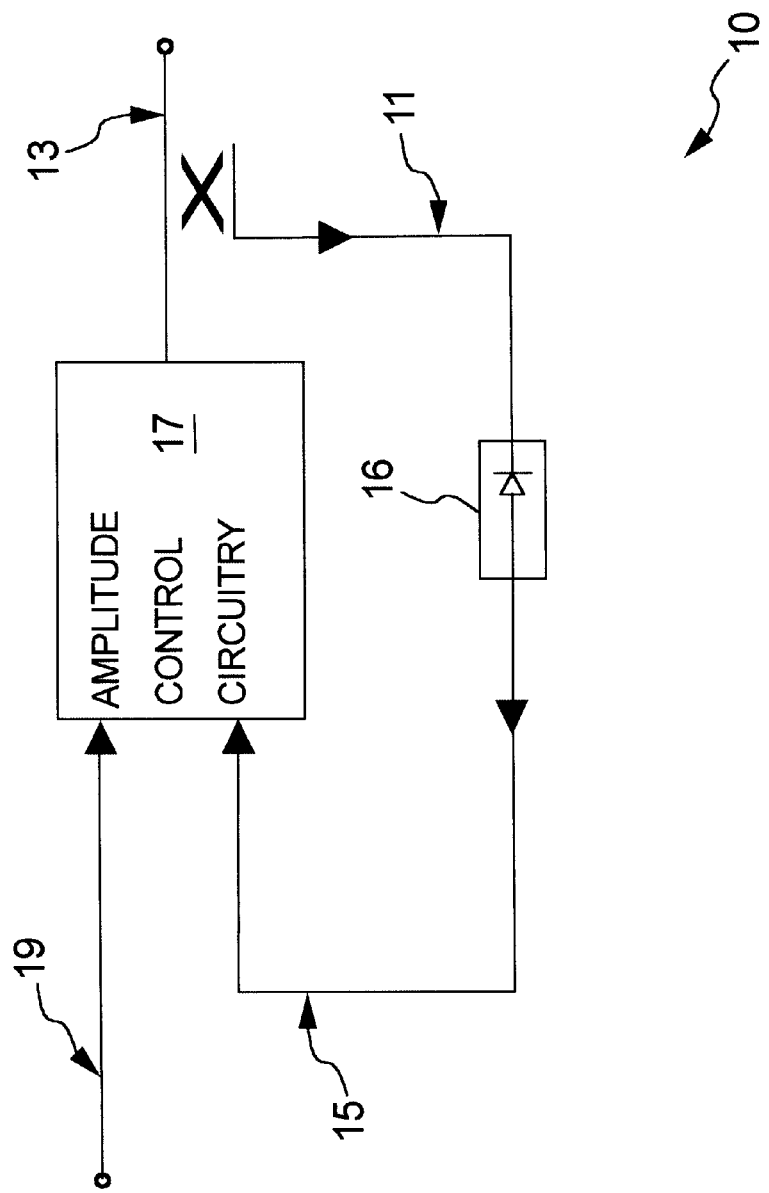
FIG. 1 shows an example of an electronic system for use in the temperature stabilization scheme constructed according to the preferred embodiment of the present invention.

FIGS. 1–6 show aspects of the temperature stabilization scheme 8 for a circuit board 12 constructed according to the preferred embodiment of the present invention. The temperature stabilization scheme 8 reduces the influence of temperature variations on the performance of an electronic system 10 that is implemented on a circuit board 12. In the temperature stabilization scheme 8, the circuit board 12, upon which the electronic system 10 is implemented, has an isolated region 14 that is coupled to a remainder of the circuit board 12 by one or more electrical pathways EP. Associated With each of the electrical pathways EP is an incidental thermal conduction path TP between the isolated region 14 and the remainder of the circuit board 12. A temperature sensitive component 16 of the electrical system 10 is coupled to a mounting site 18 on the isolated region 14 and interfaces with the remainder of the circuit board 12 through the one or more electrical pathways EP. A series of heaters H, thermally coupled to the isolated region 14 provides a compensating thermal profile 20 that opposes thermal instability caused by the incidental thermal conduction paths TP, where the opposition is over a portion 22 of the isolated region 14 that includes at least the mounting site 18 of the temperature sensitive component 16. The series of heaters H also sets the isolated region 14 to a predetermined average temperature $T_{AVE}$.

FIG. 1 shows one type of electronic system 10 implemented on the circuit board 12. This type of electronic system 10 is used to illustrate the temperature stabilization scheme 8 constructed according to the preferred embodiment of the present invention. Other types of electronic systems 10 implemented on circuit boards 12 are alternatively used in the temperature stabilization scheme 8. In this example, the electronic system 10 is an amplitude control system (also referenced as element 10) and the temperature sensitive component 16 is a detector (also referenced as element 16). The function and construction of amplitude control systems 10, alternatively known as automatic level control (ALC) loops, are well known in the art.

In the amplitude control system 10, the RF detector 16 receives a coupled signal 11 derived from an output signal 13. The detector 16 generates a feedback signal 15 from the coupled signal 11 that is applied to amplitude control circuitry 17 within the amplitude control system 10. The amplitude control circuitry 17, in turn, processes this feedback signal 15 to provide the output signal 13 with an accurately designated amplitude level, even though an input signal 19 applied to the amplitude control circuitry 17 may have a variable, or otherwise unstable, amplitude level. Temperature variations imposed on the detector 16 induce changes in the feedback signal 15 that result in corresponding changes in the amplitude level ofthe output signal 13, thereby degrading the amplitude level accuracy of the amplitude control system 10. The temperature stabilization scheme 8 constructed according to the preferred embodiment of the present invention reduces the influence of temperature variations on the performance of the amplitude control system 10 or of other types of electronic systems 10 that are implemented on the circuit board 12.

The temperature sensitive component 16 in the amplitude system 10 is the detector. However, there are many different types of temperature sensitive components 16 that are suited for inclusion in the temperature stabilization scheme 8. Temperature sensitivity of the temperature sensitive component 16 results from inherent characteristics of the temperature sensitive component 16, from type of electronic system 10 in which the temperature sensitive component 16 is included, or the temperature sensitivity results from how the temperature sensitive component 16 is used in the electronic system 10. As examples, the temperature sensitive component 16 is an active device, a passive device or a series of active or passive devices that have temperature dependent characteristics. Alternatively, the temperature sensitive component 16 is a thermally stable device that exhibits temperature dependent characteristics due to thermocouple voltages that arise from mounting the component on the circuit board 12.

Figure 2:
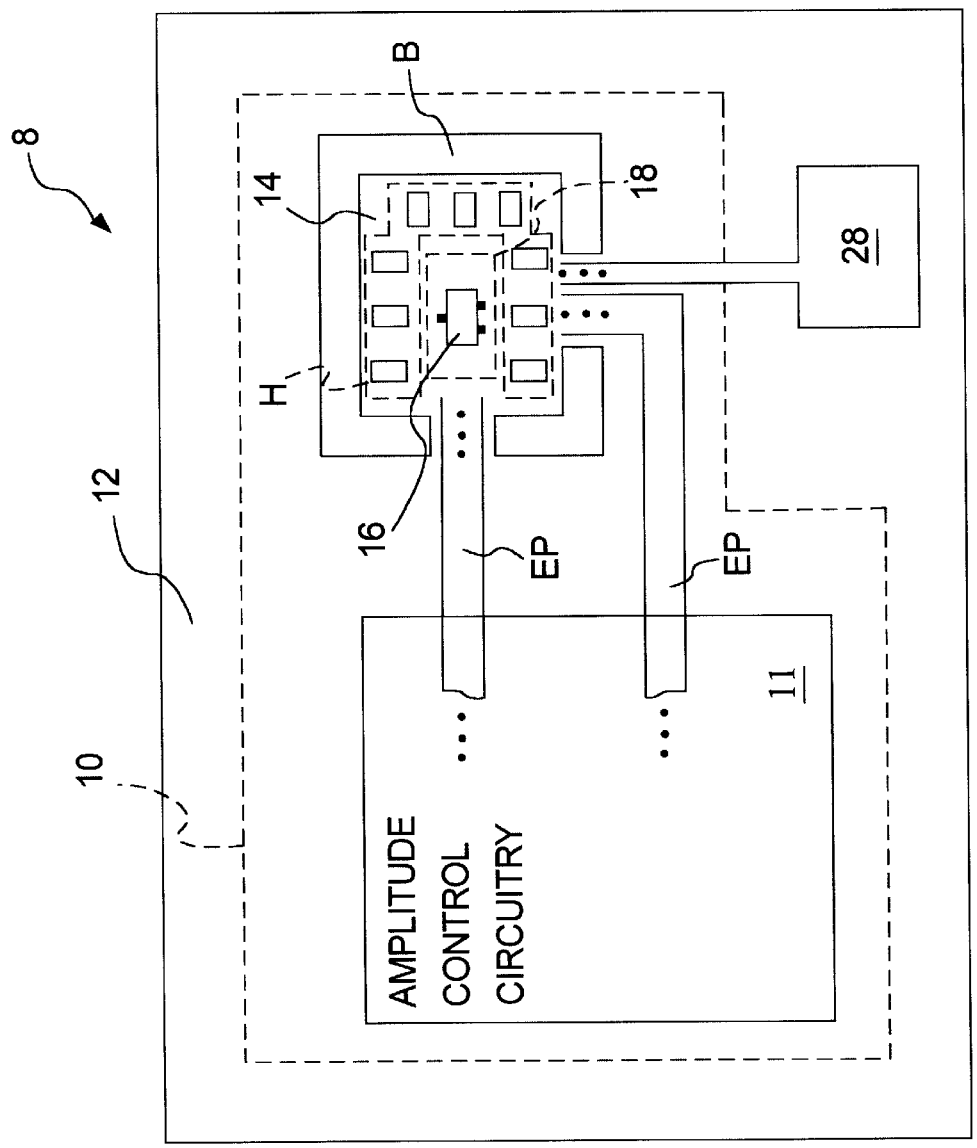
FIG. 2 shows the temperature stabilization scheme constructed according to the preferred embodiment of the present invention.

FIG. 2 shows the temperature stabilization scheme 8 for the circuit board 12, constructed according to the preferred embodiment of the present invention. The circuit board 12 upon which the electronic system 10 is implemented is a printed circuit (PC) board. Alternatively, the circuit board 12 is a thin film circuit board, a thick film circuit board, or other type of substrate suitable for implementing the electronic system 10.

The isolated region 14 within the circuit board 12 is defined by a gap, series of perforations (not shown), or other thermally insulating boundary B interposed between the isolated region 14 and the remainder of the circuit board 12. The one or more electrical pathways EP that couple the isolated region 14 to the remainder of the circuit board 12 include metal traces, typically of the type present on the remainder of the circuit board 12. Transmission lines, or other electrically interfacing structures or topologies alternatively form the one or more electrical pathways EP. The thermal conduction paths TP incidental to the one or more electrical pathways EP results from high thermal conductivity of the metal traces, electrically interfacing structures or topologies, relative to the low thermal conductivity of the insulating boundary B.

The mounting site 18 on the isolated region 14 that provides coupling of the temperature sensitive component 16 to the isolated region 14 is a pattern of metal traces, a conductive footprint, or other recepticle adapted to receive the temperature sensitive component 16. The heaters H are thermally coupled to the mounting site 18 of the isolated region 14 of the circuit board 12 with solder, epoxy or other type of fastener suitable for providing the thermal coupling. The series of heaters H, are one or more discrete resistors, distributed resistors, semiconductors or other type of converters of electrical energy to thermal energy. Typically, the type of heaters H is chosen for compatibility of the heaters H with the technology used to implement the electronic system 10 on the circuit board 12. For example, when the electronic system 10 is implemented using surface mount technology, the heaters H are typically chosen to be discrete surface mount resistors or discrete surface mount semiconductors. When the electronic system 10 is implemented using thin film or thick film technology, the heaters H are typically chosen to be distributed film resistors, discrete chip resistors or discrete semiconductors. However, as there are numerous other technologies that are suited for implementing electronic systems 10 on a circuit board 12, there are numerous other types of heaters H that are compatible with these technologies.

Figure 3A:
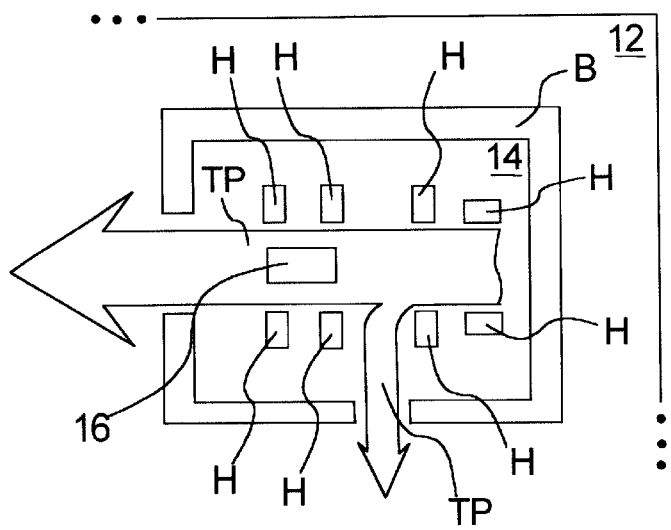
FIGS. 3A–3B and 4A–4B are alternative detailed views of the temperature stabilization scheme constructed according to the preferred embodiment of the present invention.
Figure 3B:
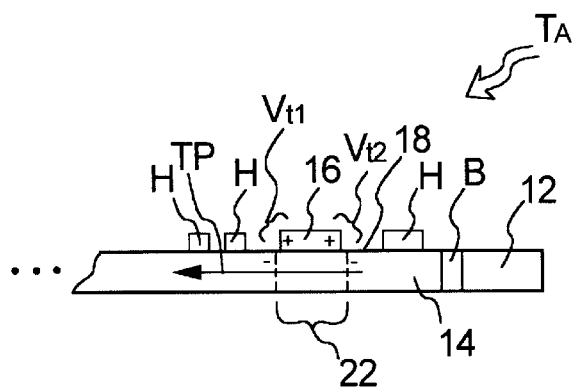
Figure 3B:
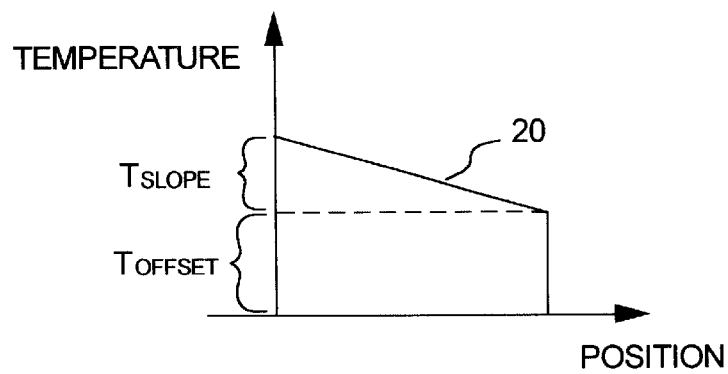

The thermal conduction paths TP are indicated in the detailed views of the isolated region 14 within the circuit board 12 shown in FIG. 3A (top view) and FIG. 3B (side view). The thermal conduction paths TP cause thermal instability over the isolated region 14. However, this thermal instability is opposed by the compensating thermal profile 20 provided by the series of heaters H, where this opposition is over the portion 22 of the isolated region 14 that includes at least the mounting site 18 of the temperature sensitive component 16. The compensating thermal profile 20 temperature stabilizes the portion 22 of the isolated region 14, so that the portion 22 has a sufficiently constant temperature to enable a predesignated performance for the electronic system 10 to be achieved. For example, when the electronic system 10 implemented on the circuit board 12 is the amplitude control system 10, the compensating thermal profile 20 provides a sufficiently constant temperature to the portion 22 to achieve a predesignated amplitude level accuracy. By setting the portion 22 of the isolated region 14 to a predetermined average temperature $T_{AVE}$ that is greater than the maximum level of an ambient temperature $T_A$, the influence of variations in the ambient temperature TA are substantially reduced. In the event that multiple thermocouple voltages, for example, thermocouple voltages Vt1, Vt2, influence the performance of the electronic system 10, the compensating thermal profile 20 temperature stabilizes the portion 22 of the isolated region 14 by making the portion 22 sufficiently isothermal to reduce the difference between the thermocouple voltages Vt1, Vt2 so that a predesignated performance for the electronic system 10 is achievable, and the influence of the thermocouple voltages Vt1, Vt2 on the system performance is substantially reduced.

An example of the compensating thermal profile 20 along an extent of the isolated region 14 is shown in FIG. 3B. The compensating thermal profile 20 includes at least one of an offset component $T_{OFFSET}$ that sets the portion 22 to the average temperature $T_{AVE}$ and a slope component $T_{SLOPE}$ that makes the portion 22 of the isolated region 14 sufficiently isothermal. While the slope component $T_{SLOPE}$ of the compensating thermal profile 20 is shown to have a linear profile in FIG. 3B, the slope component $T_{SLOPE}$ can have alternative contours or shapes through alternative arrangements of the series of heaters H.

Figure 4A:
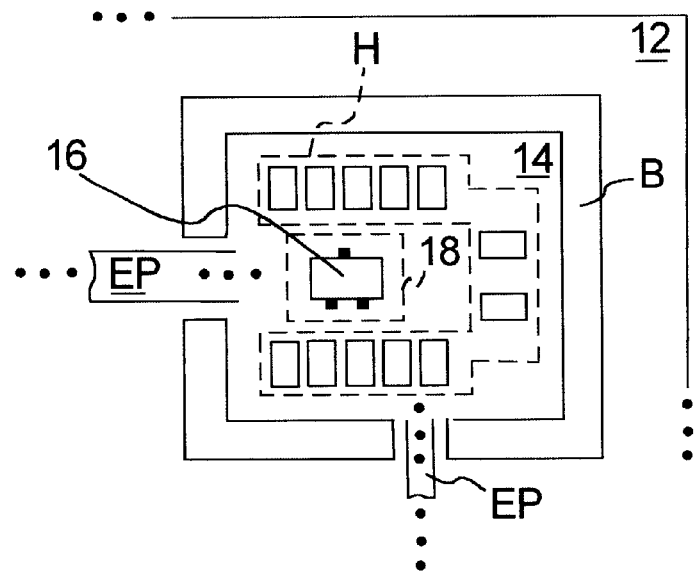
Figure 4B:
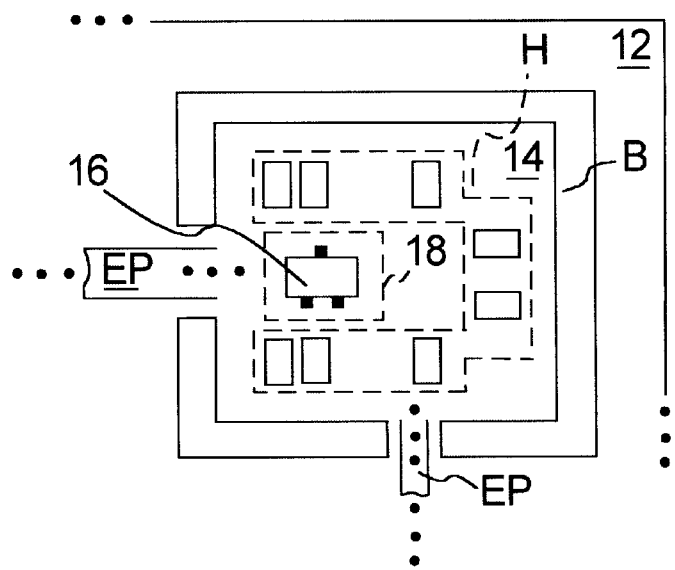
Figure 5:
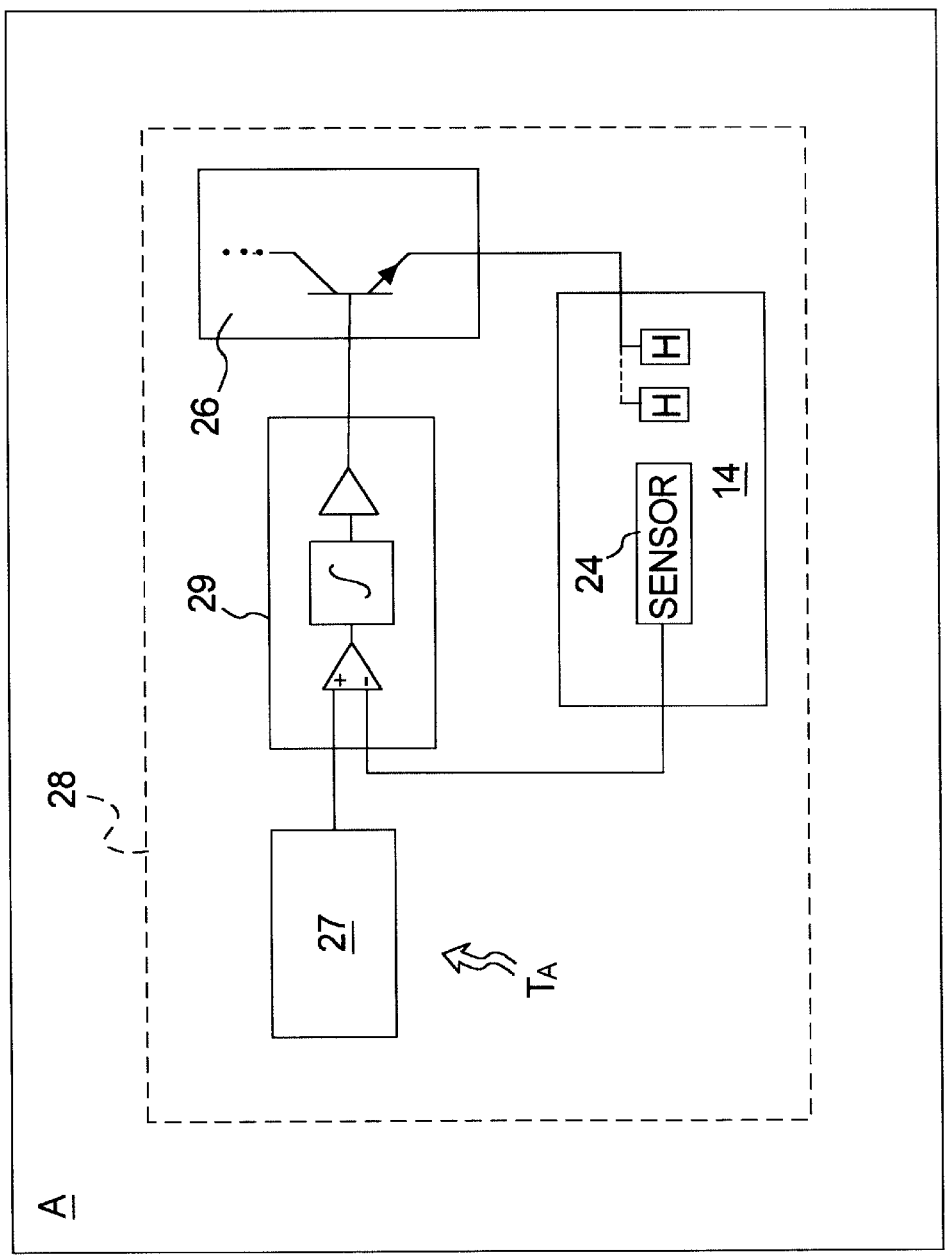
FIG. 5 shows a control loop optionally included in the temperature stabilization scheme constructed according to the preferred embodiment of the present invention.

FIGS. 4A–4B show alternative arrangements of the series of heaters H that are thermally coupled to the isolated region 14 of the circuit board 12 in order to generate the compensating thermal profile 20. Although a particular number of heaters H are shown in the series of heaters, the series of heaters H can include a different number of heaters. The slope component $T_{SLOPE}$ of the compensating thermal profile 20 is achieved by a staggered, or non-uniform physical distribution of the heaters H as shown in FIG. 4A. Alternatively, the slope component $T_{SLOPE}$ of the compensating thermal profile 20 is achieved by a nonuniform distribution of the thermal capacity of the heaters H as shown in FIG. 4B, or by non-uniform physical distribution of the heaters H and a nonuniform distribution of the thermal capacity of the heaters H.

The series of heaters H are incorporated in a control loop 28 (shown in FIG. 5) having a temperature sensor 24 (also shown in FIG. 6), thermally coupled to the isolated region 14, and having a driver 26 that adjusts the series of heaters H according to an output of the temperature sensor 24. A temperature dependent reference 27 that varies according to the ambient temperature $T_A$ is optionally coupled to heater control circuitry 29 within the control loop 28 to accommodate differences between the temperature sensed by the temperature sensor 24 and the temperature of the temperature sensitive component 16 and/or to accommodate differences in thermal resistance between the ambient environment A and the temperature sensitive component 16 and a thermal resistance between the ambient environment A and the temperature sensor 24. The control loop 28 is implemented on the circuit board 12 (as shown in FIG. 2), or the control loop 28, or selected elements of the control loop 28, are external to the circuit board 12 (not shown). As an alternative to being included in the control loop 28 and actuated in a closed-loop fashion, the series of heaters H are included in an open loop (not shown) including the temperature dependent reference 27, heater control circuitry 29, driver 26 and heaters H. The open loop is implemented on the circuit board 12 or the open loop, or selected elements of the open loop, are external to the circuit board 12.

Figure 6:
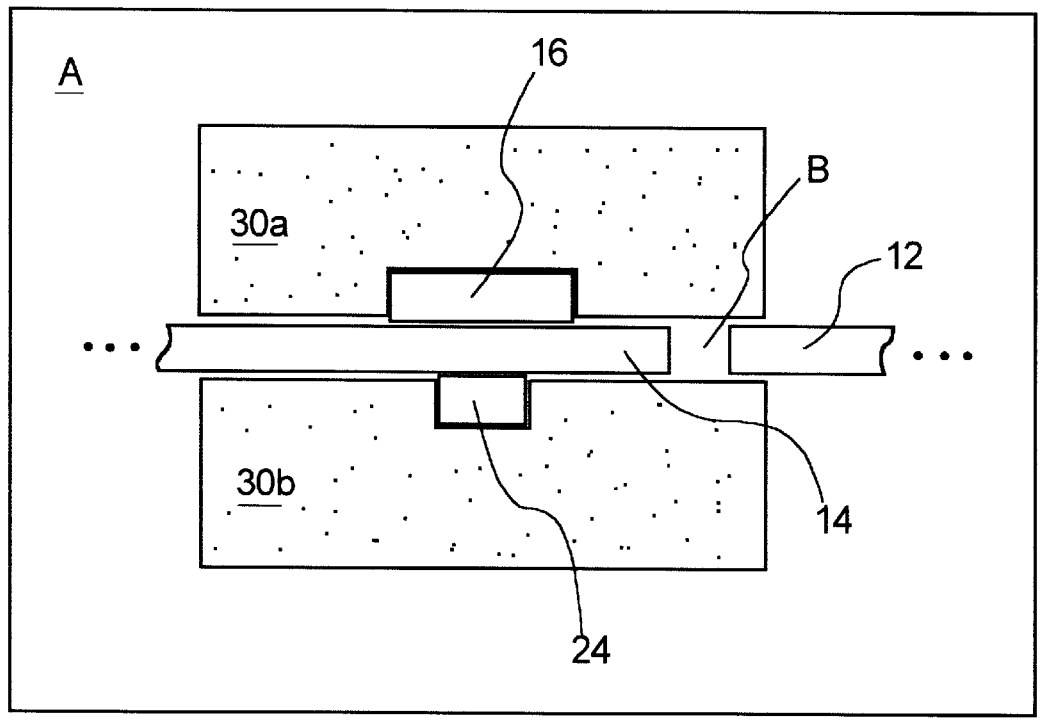
FIG. 6 shows thermal insulation optionally included in the temperature stabilization scheme constructed according to the preferred embodiment of the present invention.

FIG. 6 shows a side view of the isolated region 14 with thermal insulation 30a, 30b, optionally included in the temperature stabilization scheme 8 constructed according to the preferred embodiment of the present invention. The thermal insulation 30a, 30b is disposed about the isolated region 14 so that temperature instability imposed on the temperature sensitive component 16 by at least one of conduction, convection and radiation is reduced.

While the preferred embodiment of the present invention has been illustrated in detail, it should be apparent that modifications and adaptations to this preferred embodiment may occur to one skilled in the art without departing from the scope of the present invention as set forth in the following claims.

What is claimed is:

1. A temperature stabilization scheme for a circuit board, comprising:

an isolated region within the circuit board, coupled to a remainder of the circuit board via at least one electrical pathway, each of the at least one electrical pathway having an incidental thermal conduction path between the isolated region and the remainder of the circuit board;

an electronic system implemented on the circuit board;

a temperature sensitive component within the electronic system and coupled to a mounting site on the isolated region; and a series of heaters thermally coupled to the isolated region, providing a compensating thermal profile that opposes, over a portion of the isolated region that includes at least the mounting site, a thermal instability caused by the incidental thermal conduction path of the at least one electrical pathway, and that has at least one of an offset component setting the portion of the isolated region to a predetermined average temperature and a slope component making the portion of the isolated region isothermal.

2. The temperature stabilization scheme of claim 1 wherein the compensating thermal profile is established by at least one of a predetermined physical distribution of the series of heaters and a predetermined distribution in thermal capacity of the series of heaters.

3. The temperature stabilization scheme of claim 1 further comprising an amplitude control system implemented on the circuit board, and wherein the temperature sensitive component is a detector.

4. A temperature stabilization scheme for a circuit board, comprising:

an isolated region within the circuit board, coupled to a remainder of the circuit board via at least one electrical pathway, each of the at least one electrical pathway having an incidental thermal conduction path between the isolated region and the remainder of the circuit board;

thermal insulation disposed about the isolated region;

an electronic system implemented on the circuit board;

a temperature sensitive component within the electronic system and coupled to a mounting site on the isolated region; and a series of heaters thermally coupled to the isolated region, providing a compensating thermal profile established by at least one of a predetermined physical distribution of the series of heaters and a predetermined distribution in thermal capacity of the series of heaters, and opposing, over a portion of the isolated region that includes at least the mounting site, a thermal instability caused by the incidental thermal conduction path of the at least one electrical pathway.

5. A temperature stabilization scheme for a circuit board, comprising:

an isolated region within the circuit board, coupled to a remainder of the circuit board via at least one electrical pathway, each of the at least one electrical pathway having an incidental thermal conduction path between the isolated region and the remainder of the circuit board;

an electronic system implemented on the circuit board;

a temperature sensitive component within the electronic system and coupled to a mounting site on the isolated region; and a series of heaters thermally coupled to the isolated region, providing a compensating thermal profile established by at least one of a predetermined physical distribution of the series of heaters and a predetermined distribution in thermal capacity of the series of heaters, and opposing, over a portion of the isolated region that includes at least the mounting site, a thermal instability caused by the incidental thermal conduction path of the at least one electrical pathway.

6. A temperature stabilization scheme for a circuit board, comprising:

an isolated region within the circuit board, coupled to a remainder of the circuit board via at least one electrical pathway, each of the at least one electrical pathway having an incidental thermal conduction path between the isolated region and the remainder of the circuit board;

an electronic system implemented on the circuit board;

a temperature sensitive component within the electronic system and coupled to a mounting site on the isolated region; and a series of heaters thermally coupled to the isolated region, providing a compensating thermal profile that opposes, over a portion of the isolated region that includes at least the mounting site, a thermal instability caused by the incidental thermal conduction path of the at least one electrical pathway, wherein the series of heaters are included in a control loop having a temperature sensor thermally coupled to the isolated region and a driver adjusting the series of heaters according to an output of the temperature sensor.

7. The temperature stabilization scheme of claim 6 wherein the control loop further includes a control circuitry and a temperature dependent reference coupled to the control circuitry accommodating at least one of a difference between a temperature sensed by the temperature sensor and a temperature of the temperature sensitive component, and a difference in a thermal resistance between an ambient environment and the temperature sensitive component and a thermal resistance between the ambient environment and the temperature sensor.

8. The temperature stabilization scheme of claim 7 further comprising thermal insulation disposed about isolated region.

9. The temperature stabilization scheme of claim 6 further comprising thermal insulation disposed about isolated region.

10. A temperature stabilization scheme for a circuit board, comprising:

an isolated region within the circuit board, coupled to a remainder of the circuit board via at least one electrical pathway, each of the at least one electrical pathway having an incidental thermal conduction path between the isolated region and the remainder of the circuit board;

an amplitude control system having a predesignated amplitude level accuracy, implemented on the circuit board;

a detector included within the amplitude control system and coupled to a mounting site on the isolated region; and a series of heaters thermally coupled to the isolated region, providing a compensating thermal profile that opposes, over a portion of the isolated region that includes at least the mounting site, a thermal instability caused by the incidental thermal conduction path of the at least one electrical pathway, the compensating thermal profile including at least one of an offset component setting the portion of the isolated region to a predetermined average temperature, and a slope component making the portion of the isolated region sufficiently isothermal to achieve the predesignated amplitude level accuracy.

11. The temperature stabilization scheme of claim 10 further comprising a control loop, implemented on the circuit board, the control loop having a temperature sensor thermally coupled to the isolated region and a driver adjusting the series of heaters according to an output of the temperature sensor.

12. The temperature stabilization scheme of claim 11 wherein the control loop further includes a control circuitry and a temperature dependent reference coupled to the control circuitry accommodating at least one of a difference between a temperature sensed by the temperature sensor and a temperature of the detector, and a difference in a thermal resistance between an ambient environment and the detector and a thermal resistance between the ambient environment and the temperature sensor.

13. The temperature stabilization scheme of claim 12 further comprising thermal insulation disposed about isolated region.

14. The temperature stabilization scheme of claim 11 further comprising thermal a insulation disposed about isolated region.

15. The temperature stabilization scheme of claim 10 further comprising thermal insulation disposed about isolated region.

* * * * *